United States Patent

Cadwallader et al.

[11] Patent Number: 6,043,667
[45] Date of Patent: Mar. 28, 2000

[54] SUBSTRATE TESTER LOCATION CLAMPING, SENSING, AND CONTACTING METHOD AND APPARATUS

[75] Inventors: Robert H. Cadwallader, Clinton Corners; Thomas Morrison, Pleasant Valley, both of N.Y.; Klaus Probst, Herrenberg, Germany; William A. Yager, Salt Point, N.Y.

[73] Assignee: International Business Machines Corporation, Armonk, N.Y.

[21] Appl. No.: 08/840,834

[22] Filed: Apr. 17, 1997

[51] Int. Cl.[7] .................................................. G01R 13/02
[52] U.S. Cl. ........................................... 324/758; 324/761
[58] Field of Search .................................... 324/754, 755, 324/758, 765, 158.1, 73.1, 761–762; 356/400; 348/135, 126; 269/57

[56] References Cited

U.S. PATENT DOCUMENTS

| | | | |
|---|---|---|---|
| 4,436,385 | 3/1984 | Fischer et al. | 350/529 |
| 4,820,975 | 4/1989 | Diggle | 356/400 |
| 5,150,041 | 9/1992 | Eastin et al. | 324/758 |
| 5,422,575 | 6/1995 | Ferrer et al. | 324/754 |

Primary Examiner—Vinh P. Nguyen
Attorney, Agent, or Firm—Steven Capella

[57] ABSTRACT

A substrate tester and method of testing are disclosed in which the tester moves a substrate to be tested into a precise location within the tester prior to making contact with fragile tester pins. The substrate is then clamped in a precise X-Y location relative to the tester contact pins, also without making contact with the tester pins. Next the substrate top surface is moved quickly to a precise Z-axis location, whereupon the tester contact pins are finally applied to the substrate using Z-axis motion only. In addition, a mechanism is included that features a cam-pivot arm micro-switch combination to sense when a product is not properly positioned in or missing from the test station.

23 Claims, 11 Drawing Sheets

SUBSTRATE TESTER LOCATION CLAMPING, SENSING, AND CONTACTING METHOD AND APPARATUS

CROSS-REFERENCE TO COPENDING APPLICATIONS

Copending U.S. patent applications Ser. No. 08/840,833, filed concurrently herewith, entitled "Locator Actuation Method and Apparatus", (Attorney docket FI9-97-020), describes a method and apparatus for locating and positioning a substrate upon a surface; Ser. No. 08/840,835, filed concurrently herewith, entitled "Substrate Tester Method and Apparatus Having Rotatable and Infinitely Adjustable Locator Jaws", (Attorney docket FI9-97-021) describes a locator actuation method and apparatus for locating and positioning a substrate during manufacture and testing thereof; and Ser. No. 08/840,836, filed concurrently herewith, entitled "Substrate Tester Having Shorting Pad Actuator Method and Apparatus", (Attorney docket FI9-97-022) describes a substrate tester, all assigned to the assignee of the present invention, the disclosures of which are hereby incorporated by reference into the present application.

BACKGROUND OF THE INVENTION

1. Field of the Invention

This invention relates generally to a method and apparatus for testing of substrates and, more particularly, to a ceramic substrate tester and a glass ceramic substrate tester having substrate location clamping, sensing, and contacting.

2. Discussion of the Related Art

Substrate testers are known in the art for performing network integrity tests on substrates. A substrate refers to a packaging unit that provides an interface between a semiconductor chip (e.g. a very large scale integrated (VLSI) circuit chip) and a higher level packaging unit (e.g., a printed circuit board). A network is generally defined by a set of one or more electrically connected common points on a substrate. Networks are used to distribute electrical signals and voltages externally and/or internally about the substrate in accordance with the requirements of a particular integrated circuit chip. Substrate testers are used during substrate manufacturing to guarantee that there are no process or design created defects (corresponding to opens or shorts) on a particular substrate being tested. Typically, a substrate tester performs a test using a particular contacting scheme. A test matrix controller (or test engine) is then used to provide an electrical stimulus on each point of the networks contacted by the contacting scheme and then systematically scans the remaining points in the test matrix to guarantee all desired connections exist (opens test) and that there are no unwanted connections (shorts), as the case may be.

Glass ceramic substrates for packaging of VLSI ICs are fragile and costly to produce. In the testing of substrates, it is desirable for the tester to receive the substrate (or product) to be tested in such a way that the substrate, tester and test head(s) will not incur damage. Undesired damage can occur if the substrate is not correctly seated in the tester during the testing thereof. For example, undesirable damage to the substrate can be caused when the substrate or product under test is ajar, mispositioned, or otherwise hung up within the test station of the substrate tester. In addition, undesired damage can also occur if the substrate, during a loading or movement of the substrate within the tester, slides against the tester contacts, or probes, of the test head(s), thereby deforming the tester contacts or probes. In other words, damage to the tester test probes can also occur when the substrate being tested is ajar, mispositioned, or otherwise hung up within the test station. Tester head or probe damage is a significant expense in terms of repair and/or replacement. Note also that testing of a substrate can include front side (top) and/or back side (bottom) testing.

In known testers, the product is loaded within stationary position locators of the tester. The test head pins (i.e., contact probes) are exposed to undesirable X-Y deformation and damage during product loading in preparation for testing. Once a substrate is loaded in a desired position, the tester then compresses the test head pins in a Z-axis direction against the product under test. Any anomalies in product thickness can cause the compression to vary greatly from one product to another. Typically, the surface of the product is stationary and the test head pins are lowered to the product surface without regard to any variation in product thickness or non-planarity.

In addition, with respect to known testers, contactors (i.e., test heads) move in and out of the test station to allow an operator to load a part (i.e., product and/or substrate) to be tested. The mechanical movement in and out causes the cabling associated with the test heads to continually bend and flex. Bending and flexing of the test head cabling causes broken conductors, which leads to costly repairs. In addition to the actual cost of the cabling, the costly repairs also include costs associated with equipment down time which are incurred until repairs can be made.

Still further, in other approaches, the substrate part to be tested is placed on top of an array of spring plunger probes, wherein the probes are compressed against test pads on the substrate or product. This approach, however, increases the opportunity for movement of the product. Movement of the product is not desirable since any movement would cause the product to scrape against any contacting surfaces, for example, of a locating nest or position locator. As a result, the spring plunger probe arrangement contributes to incidents of broken product, damaged product and damaged equipment.

It would thus be desirable to provide a method and apparatus for elimination of damage to product and to test probes resulting, for example, from product being ajar or otherwise hung up in a test station. Furthermore, it would be desirable to provide a mechanism to prevent damage due to mispositioned product in a substrate tester. Still further, it would be desirable to provide a substrate tester capable of loading and unloading a substrate to be tested quickly and accurately without damage.

SUMMARY OF THE INVENTION

An object of the present invention is to provide a substrate tester in which a tester operator can insert a substrate to be tested into a product carrier, wherein the product carrier is used to move the substrate into the tester quickly and accurately without damage.

Another object of the present invention is to provide a method for moving a substrate into a substrate tester, critically align the substrate network contact points with the tester contacts, perform a substrate network test and then return the tested substrate to the operator in an expeditious manner.

It is a further object of the present invention to eliminate product damage during test caused by movement of the product when test head probing forces are applied to the product.

Still further, another object of the present invention is the elimination of product and probe damage due to improper non-rigid support.

Yet another object of the present invention is that test head cable movement is dramatically reduced thus avoiding conductor wiring breakage.

The method and apparatus according to the present invention act to move a substrate into a precise location in a tester prior to making contact with the fragile tester pins.

According to the present invention, a method and apparatus is disclosed for moving a substrate to be tested into a tester without making contact with tester contact pins. The substrate is then clamped in a precise X-Y location relative to the tester contact pins, also without making contact with the tester pins. Next the substrate top surface is moved quickly to a precise Z-axis location, whereupon the tester contact pins are finally applied to the substrate using Z-axis motion only.

In further accordance with the present invention, a substrate tester for testing a substrate according to a particular testing operation includes a substrate carrier for receiving the substrate to be tested therein. The substrate carrier includes a rough locator for roughly locating the substrate therein with respect to the product carrier. A lift plate includes a first test head assembly and a substrate locator mechanism thereon, the lift plate being disposed for travel in a z-axis direction between a home position, an intermediate position, and a probing position. The lift plate further includes mechanical stop pins thereon. A carrier plate includes slots therein for horizontally receiving the substrate carrier, the carrier plate being disposed for travel in the z-axis direction between the intermediate position and the probing position. A bridge plate is disposed above the lift plate and the carrier plate. The bridge plate includes a second test head assembly mounted on an underside thereof, the second test head assembly having a electrical contact disposed at the z-axis probing position. Lastly, a controller is provided for controlling a travel of the lift plate from the home position to the probing position, wherein the mechanical stop pins of the lift plate pick up the carrier plate at the intermediate position. In addition, at the intermediate position, a top surface of the first test head assembly engages the product carrier from below and the substrate locator mechanism accurately positions, locates, and clamps the substrate with respect to an exact center of the substrate in a precise X-Y location.

The present invention further includes a mechanism that features a cam-pivot arm micro-switch combination to sense when a product is not properly positioned in or missing from the test station.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 1:
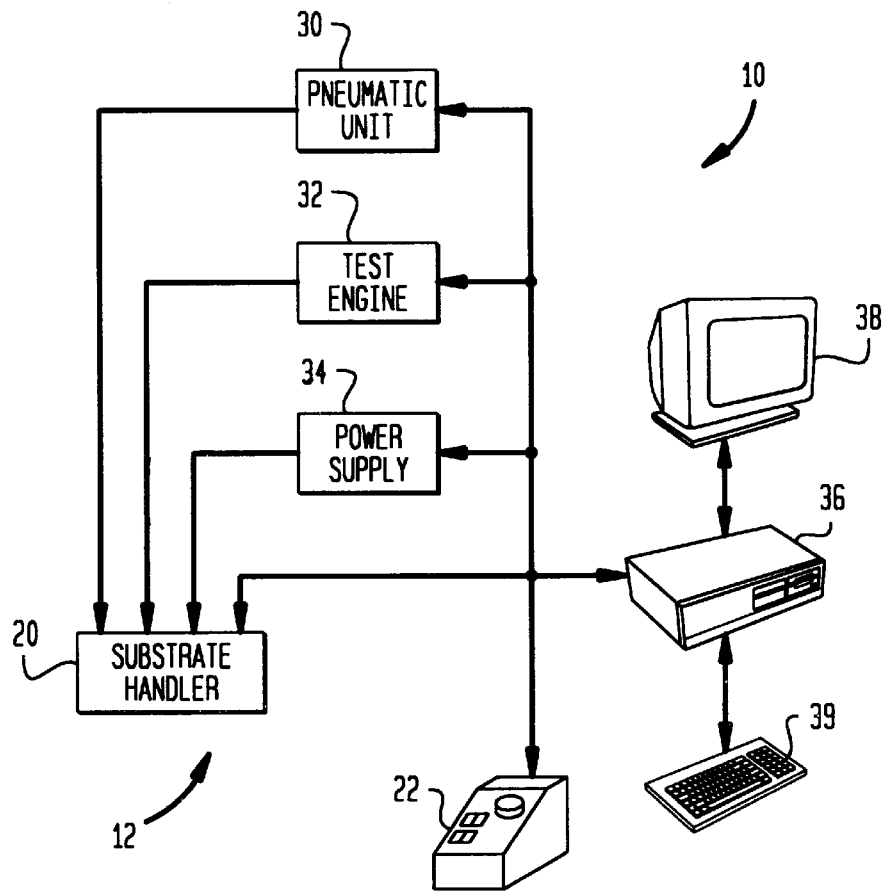
FIG. 1 illustrates a universal substrate tester in accordance with the present invention.

Referring now to FIG. 1, a universal substrate tester 10 is shown which includes test station 12. Test station 12 can be set up for the testing of one type of particular substrate or may be set up for the testing of different types of substrates with appropriate changes and/or adjustments. That is, the product to be tested includes any given substrate having a size dimension and a set of internal/external networks. The test station 12 of substrate tester 10 is set up at any given time for the testing of a particular substrate. Furthermore, test station 12 can include a mechanical handler 20 (labeled "substrate handeler" in FIG. 1), an operator panel 22, and other various electronic components of the tester 10. For example, tester 10 further includes a pneumatic unit 30, a test engine 32, a main power supply 34, and a computer 36 with display 38 and keyboard 39. Pneumatic unit 30 allows air to be brought to air cylinders which drive various pneumatic mechanisms in and out, as shall be discussed herein below.

Test engine 32 provides a prescribed electrical stimulus for application on each point of the networks contacted by a contacting scheme. Test engine 32 further systematically scans the remaining points in a test matrix to guarantee all desired connections exist (opens test) and that there are no unwanted connections (shorts), as the case may be, in accordance with a particular testing operation conducted with tester 10. Power supply 34 provides various voltages and signals as may be required for a particular testing operation by tester 10. Computer 36 is programmed for performing desired computational and control functions of a testing operation of tester 10 in accordance with the present invention using known programming techniques, and thus the particular programming of computer 36 is not discussed herein. Tester 10 may also include an appropriate electronic interface panel(not shown) to provide interface circuitry, as necessary.

Computer 36 can receive test information, such as, the type of product to be tested, via keyboard 39. Computer 36 can also be used for test inquiries, such as, providing test status or other feedback as may be desired for a particular testing operation. Test status may include the number of detected shorts or opens found for a substrate being tested. The test engine 32 can be used to perform an exercising of the test station 12 itself, for example, for performing a substrate test and providing test results back to the computer 36. While computer 36 and test engine 32 are shown as two separate units, the computer 36 and test engine 32 may include the same unit, computer, or controller for performing necessary data acquisition and control functions for a particular substrate being tested.

Figure 2:
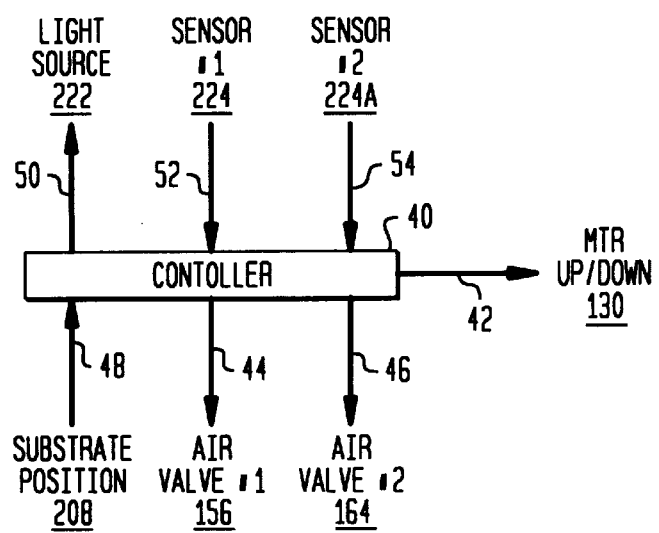
FIG. 2 illustrates an exemplary controller for use with the substrate tester according to the present invention.

Turning now to FIG. 2, computer 36 of FIG. 1 may alternatively include, or operate in conjunction with, a programmable controller 40 for use with the substrate tester 10 according to the present invention. Controller 40 can be programmed for performing desired functions in accordance with the present invention using programming techniques known in the art, thus the particular programming of controller 40 is not discussed herein. Controller 40 receives input signals on respective inputs and provides output signals on corresponding outputs, as shall be discussed further herein below. For example, controller 40 provides a motor control signal on output 42. The motor control signal controls a direction and speed of a motor as needed and as will be explained in further detail below with respect to the mechanical handler 20. Outputs 44 and 46 provide control signals to respective air valves for providing a desired actuation of an air supply or vacuum suction as needed and as will be explained in further detail below with respect to test station test heads. A substrate position signal is received on input 48, as will be discussed further herein below with respect to the positioning of the substrate within the mechanical handler 20. In addition, output 50 provides a light source control signal. First and second sensor inputs 52 and 54, respectively, receive first and second light sensor signals as will be discussed further herein below with respect to a mechanism for sensing a precise positioning of a top surface of the substrate within the mechanical handler of the test station. Controller 40 may also include other inputs and outputs as may be required for a particular substrate testing operation.

Figure 3:
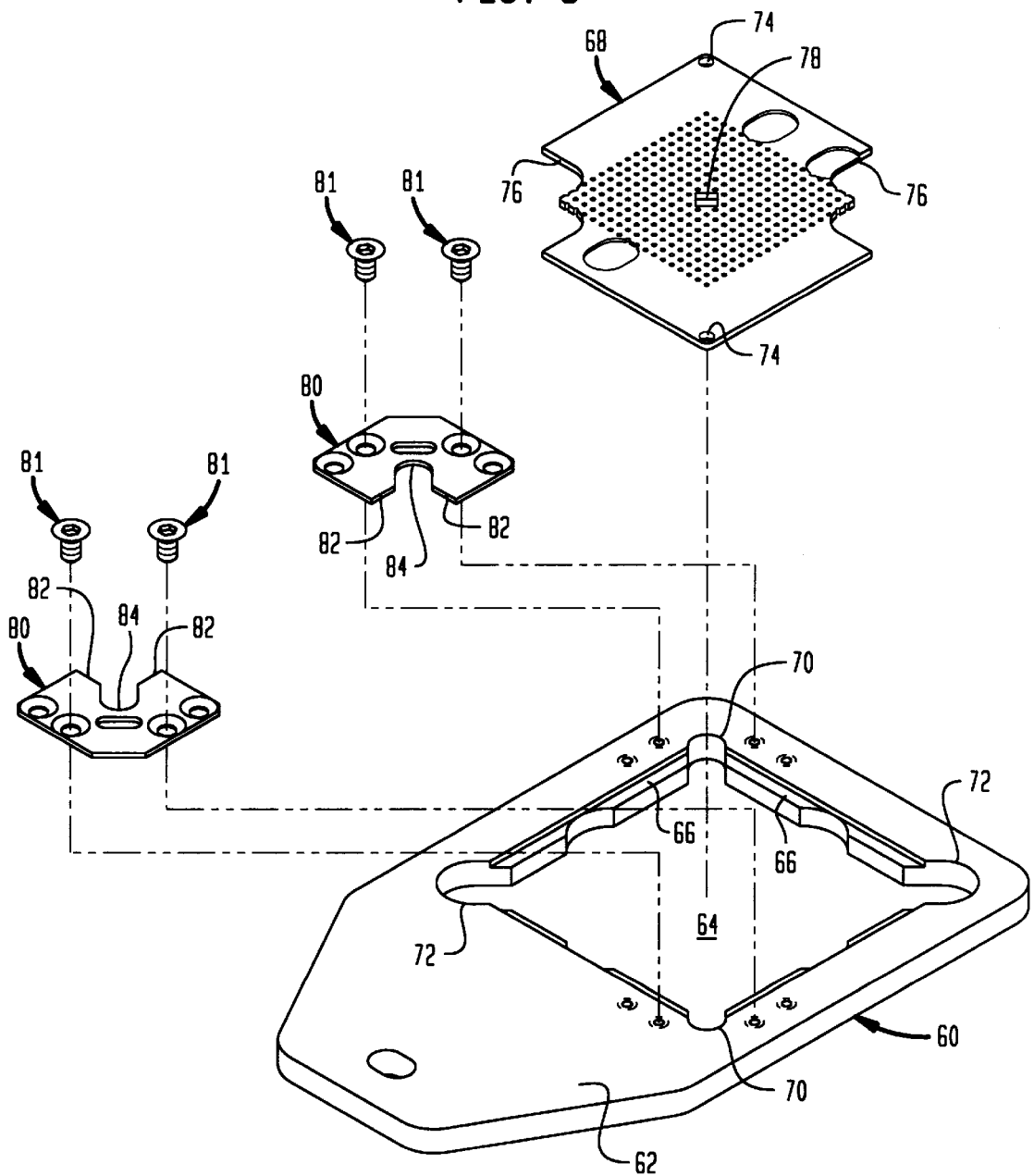
FIG. 3 illustrates a perspective view of a product carrier for use with the substrate tester according to the present invention.

Now turning to FIG. 3, a product carrier 60 (also referred to as a substrate carrier) for use with the mechanical handler 20 of the test station 12 includes a generally elongated plate 62 having an product support aperture 64 therein. Plate 62 preferably includes a durable plastic or phenolic. Aperture 64 is referred to as the product support aperture, for lack of a better term, since the product (i.e., substrate) to be tested shall be supported within an area defined by the boundary of the aperture 64 of plate 62. As shown, aperture 64 is of a generally square shape. Aperture 64 further includes a specially tapered aperture characterized by a ridge 66 for supporting a sieve plate 68. Still further, product support aperture 64 includes a first opposite corner pair 70 having alignment clearance bores. Each alignment clearance bore is of a sufficient dimension for enabling an alignment pin to pass there-through, as will be discussed further herein below. Product support aperture 64 still further includes a second opposite corner pair 72 having locator jaw clearance openings therein. Each locator jaw clearance opening is of a sufficient dimension for enabling a locator jaw to pass there-through, as will also be discussed further herein below.

Sieve plate 68 is a plate matched for mating engagement with ridge 66. Sieve plate 68 preferably is a durable plastic material, such as, VESPEL, a registered trademark of DuPont Corporation. Sieve plate 68 thus provides a rigid support surface for supporting a product to be tested during a testing operation. Sieve plate 68 further includes a first opposite corner pair having alignment apertures 74 for use in providing a desired alignment and a second opposite corner pair, each corner 76 having a shape for providing a necessary locator jaw clearance, to be discussed further herein below. Still further, sieve plate 68 includes one or more probe clearance apertures 78, as may be necessary therein, for enabling a probing of the product from an underside thereof, as shall also be discussed further herein below.

Referring still to FIG. 3, product carrier 60 further includes a pair of rough locators 80 for roughly locating a product (i.e., substrate) upon product carrier 60 in preparation for loading of the product carrier 60 (having a substrate to be tested placed thereon) into test station 12 for a testing operation. Rough locators 80 are secured to product carrier 60 using suitable fasteners 81 in the region of the first opposite corner pair 70 of product support aperture 64. Upon assembly of the product carrier 60, the sieve plate 68 is positioned upon ridge 66 in the appropriate corner orientation, after which rough locators 80 are fastened to plate 62. Sieve plate 68 is thus held within aperture 64. Sieve plate 68 can also be allowed to float in a vertical direction between ridge 66 and rough locators 80 by providing a vertical spacing between ridge 66 and a bottom surface of respective rough locators 80 which is greater than a thickness of the sieve plate 68 to allow a desired degree of floating movement.

Rough locators 80 are each characterized by a square or right angle surface, hereinafter referred to as a V-shaped engagement surface 82. Engagement surface 82 includes a clearance bore 84 at the bottom of the V-shape for providing a corner clearance for a corner of the substrate or product therein during a rough locating of the substrate or product upon product carrier 60. As mentioned above, rough locators 80 are used for roughly locating a substrate upon product carrier 60. In that regard, rough locators 80 are spaced apart from one another by a prescribed distance for allowing a desired amount of clearance between the rough locators and corresponding corners of a substrate or product being roughly located upon product carrier 60. Rough locating is to be contrasted with accurately locating, as will become apparent further herein below with respect to a discussion of locator jaws 182.

Turning now to FIGS. 4–7, the test station 12 and mechanical handler 20 shall be discussed in further detail, wherein test station 12 shall be understood to provide a unique mechanism for the deflecting of test probes 90 against network test pads (not shown) on a product substrate 92. As mentioned herein above, FIGS. 4–7 illustrate a side view of the test station 12 of the substrate tester 10 and portions thereof. Some features as shown in FIGS. 4–7 are shown in partial cross-section, at various operating positions, as shall be further discussed below.

Four principal guide posts 94 (only two are shown, as the remaining two are hidden from view in the front view of the test station as shown in FIGS. 4–7) are fixed between a base plate 96 and a bridge plate 98. A lift plate 100 is also provided.

Figure 4:
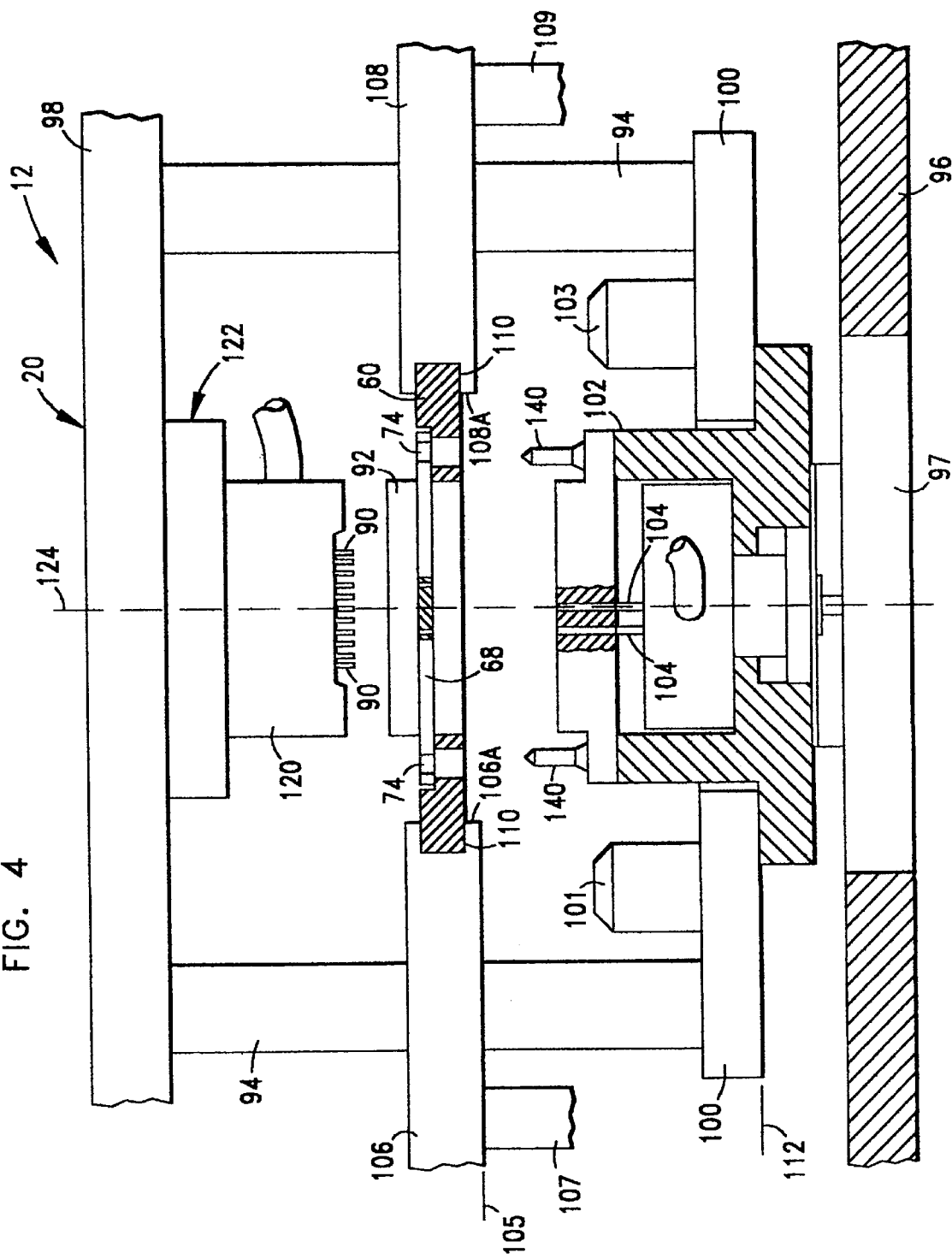
FIGS. 4–7 illustrate a side view of the test station of the substrate tester and portions thereof according to the present invention, including some features in partial cross-section, at various operating positions.

In accordance with one embodiment of the present invention, lift plate 100 includes a first test head assembly 102 mounted therethrough from an underside thereof. Test head assembly 102, as shown in FIG. 4, is a backside contact test head which may include, for example, an input/output (I/O) contactor assembly. The backside contact test head 102 includes probe contacts 104 for making contact with an underside or backside of product 92, as will be discussed further herein below with respect to FIG. 8. Backside contact test head 102 is mounted to lift plate 100 from an underside of lift plate 100 to permit easy access from an underside of test station 12. That is, easy access is provided for allowing a substitution and/or replacement of a first test head with another test head, as may be required for a particular testing operation or the setting up for testing of a different type substrate. A suitable aperture or opening 97 is provided in base plate 96 for that purpose. Lift plate 100 slides up and down on and is guided by posts 94. Sliding of lift plate 100 upon guide posts 94 is enabled, for example, with the use of any suitable bearings (not shown).

First and second carrier plates 106 and 108 are also provided. Carrier plates 106 and 108 are each free to slide on and are guided by a respective separate pair of guide posts 94 (only the foremost guide posts 94 of each pair of guide posts 94 for guiding respective carrier plates 106 and 108 are shown in the FIGS., as the hidden guide posts are located directly behind those which are shown). Sliding of carrier plates 106 and 108 on respective posts 94 is enabled, for example, with the use of any suitable bearings (not shown). First and second carrier plates 106 and 108 are supported at an initial vertical level (designated by numeral 105 in FIG. 4) by respective pairs of support posts 107 and 109, respectively. Only one of each pair of support posts 107 and 109 are shown, as the others are hidden. First and second carrier plates 106 and 108 further include respective horizontally oriented receiving slots 110 on sides 106A and 108A thereof which face each other as shown in FIG. 4. Receiving slots 110 are for receiving product carrier 60 translationally therein.

Figure 13:
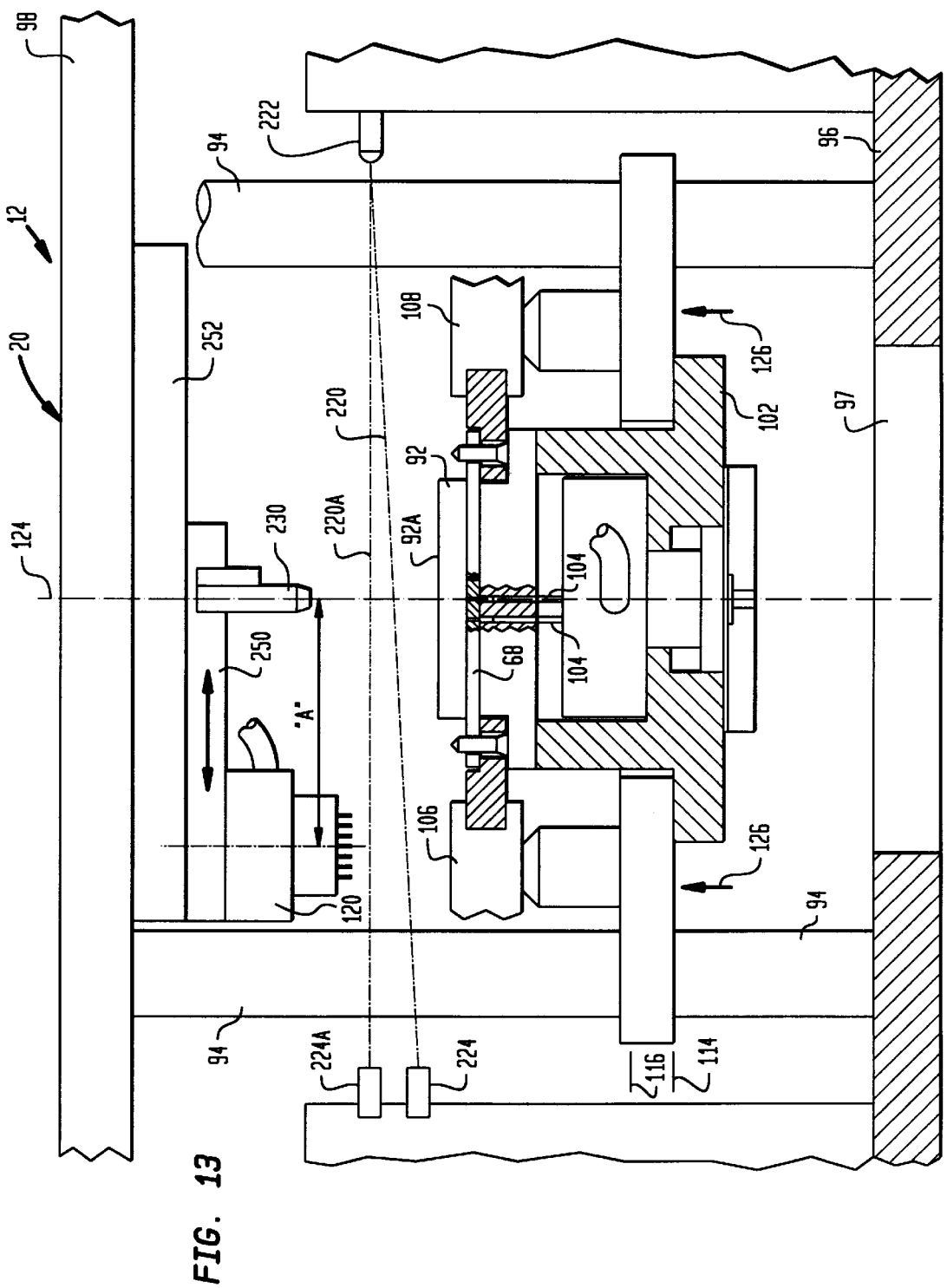
FIG. 13 illustrates a side view of the test station, including some features in partial cross-section, at the operating position as shown in FIG. 5, including a mechanism for sensing a precise positioning of a top surface of the substrate within the test station in accordance with another embodiment according to the present invention.

A second test head assembly 120 is mounted to an underside of bridge plate 98 using a translational slide 122, the later of which will be discussed in further detail with respect to FIG. 13. Test head assembly 120 includes test probes 90 to be contacted with network test pads (not shown) on the top surface of product substrate 92. In one embodiment, test head assembly 120 includes, for example, a buckling beam probe assembly. Buckling beam probe assemblies are known in the art and thus not further discussed herein. During a testing operation, first and second test head assemblies 102 and 120 are aligned vertically with one another along a principal axis 124.

The present invention enables the use of the product carrier 60 to feed the test station 12 instead of moving a test head assembly or contactor, with cables attached, in and out from a testing station. The present invention thus solves the problem of cable fatigue and breakage in that cable movement associated with a test head contactor is dramatically reduced thus avoiding conductor wiring breakage.

As mentioned herein above, product carrier 60 includes floating sieve plate 68. Referring still to FIG. 4, product carrier 60 slides in and out of the test station 12 (i.e., corresponding to in and out of the page), and thus mechanical handler 20, via receiving slots 110 in carrier plates 106 and 108. Test product or substrate 92 is shown resting on sieve plate 68 of product carrier 60. Further with reference to FIG. 4, test station 12 is shown in which various component parts of the mechanical handler 20 are in a retracted or "Product-Load" state. In the "Product-Load" state, carrier plates 106 and 108 rest upon support posts or stops 107 and 109, respectively, corresponding to carrier plates 106 and 108 being at the vertical level indicated by reference numeral 105. Lift plate 100 and I/O contactor assembly 102 are also shown being located in a low position, corresponding to a starting or home position as indicated by reference numeral 112.

Figure 5:
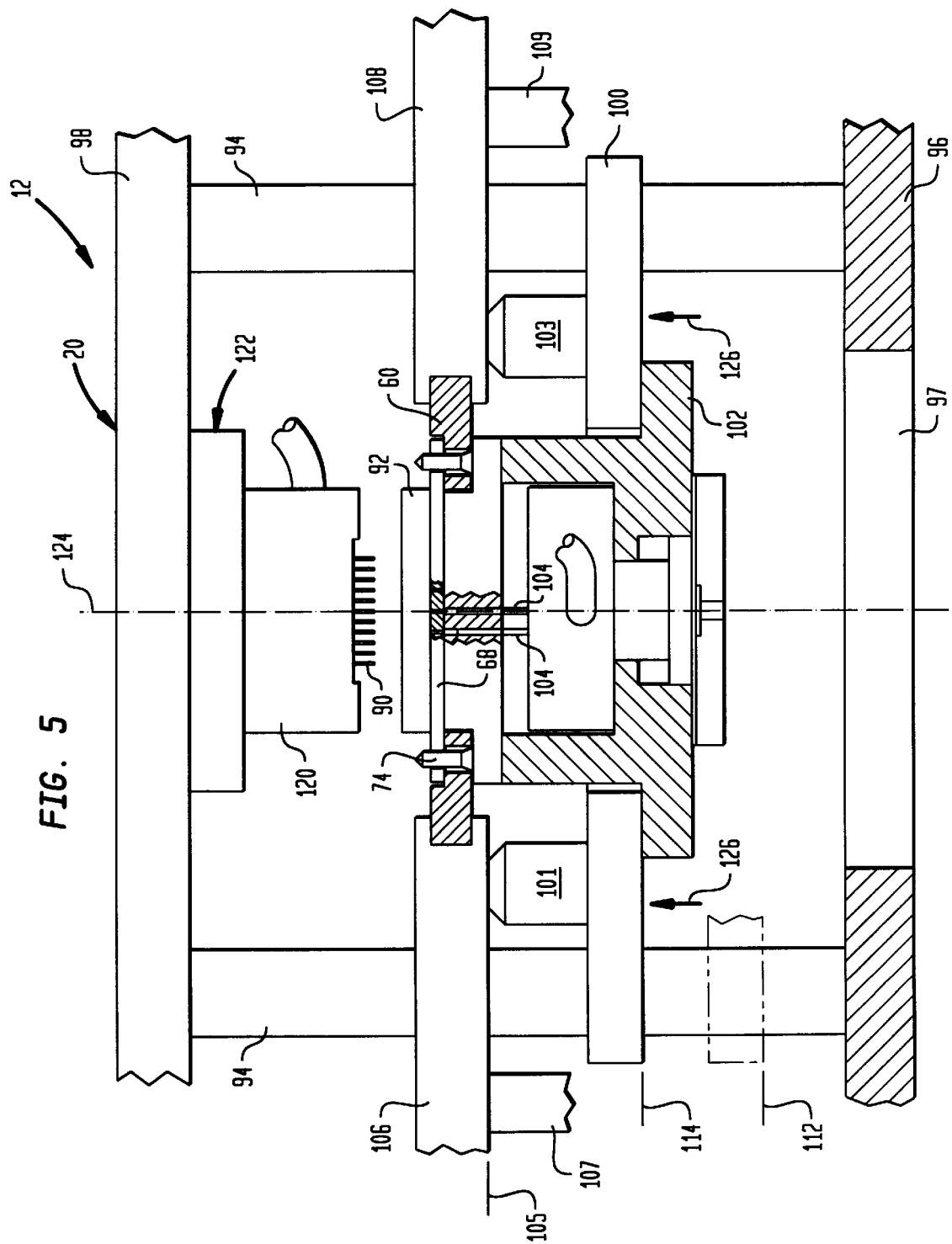

Referring now to FIG. 5, test station 12 is shown in a first stage of actuation of a testing operation. In the first stage of actuation, lift plate 100 is driven in an upward direction, as indicated by arrows 126, from the home position 112 to a first stage actuation position as indicated by reference numeral 114.

Figure 6:
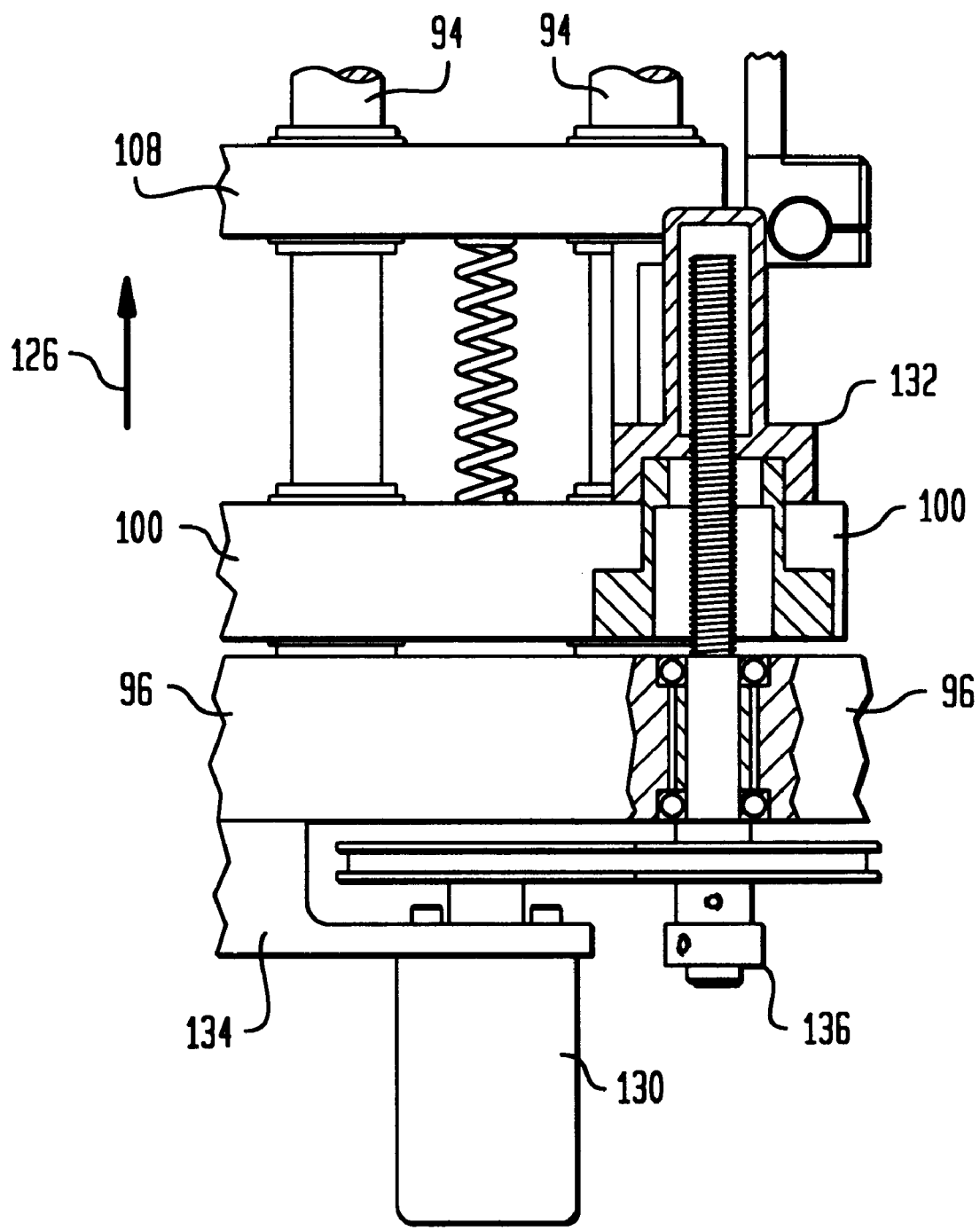

Lift plate 100 is driven in the upward direction 126, for example, by a suitable gear motor 130 and a lead screw-and-nut assembly 132, as shown in FIG. 6. Similarly, lift plate 100 may also be driven in an opposite, downward direction by gear motor 130 and a lead screw-and-nut assembly 132, as needed. FIG. 6 illustrates a side view of test station 12 from which gear motor 130 can be seen, FIG. 6 showing a different side view than FIGS. 4,5, and 7. The gear motor 130 is mounted to an underside of base plate 96 using a suitable mounting bracket 134. The gear motor 130 is further suitably coupled to a shaft 136 for providing a desired rotation to lead screw-and-nut assembly 132, for example, in accordance with a motor control signal from controller 40. Gear motor 130 can thus be controlled in a first instance for driving lift plate 100 in the upward direction and in a second instance for driving lift plate 100 in the downward direction.

Referring now from FIG. 4 to FIG. 5, lift plate 100 is driven upward causing pilot pins 140 to enter location alignment apertures 74 in sieve plate 68. Each pilot pin 140 has a tapered shape for providing a desired self-aligning action as the pin traversed up into a corresponding alignment aperture. The action of the pilot pins 140 entering the alignment apertures 74 aligns sieve plate 68 such that probe clearance apertures 78 are aligned with I/O contactor pins 104 of backside contact test head 102. When a top of stripper plate 99 contacts the bottom of sieve plate 68, stop pins 101 and 103 will contact the bottom of carrier plates 106 and 108, respectively. Thus, as the gear motor 130 continues to drive in the upward direction beyond position 114, lift plate 100 and carrier plates 106 and 108, along with test product 92 will move upward together towards second test head assembly 120. As test product 92 is moved upward, product 92 is further driven up against buckling beam probes 90 of test head assembly 120 causing buckling beam probes 90 to contact prescribed network test pads on a top surface of product 92. Upon achievement of test contact with product 92, substrate tester is used to perform the necessary continuity and shorts tests on the networks of the product 92 according to a particular opens and shorts testing scheme.

In accordance with one embodiment of the present invention, the forces required to be exerted between the buckling beam probes 90 and a given product 92 are pre-calculated and correlated with a particular drive current required by gear motor 130 (of FIG. 6) for maintaining a corresponding torque. That is, the required probing force necessary for a given product testing is correlated to the current required to drive the gear motor to generate the required torque. In this manner, the motor current can be pre-set to produce a precisely correct probe deflection force for a given product under test.

Figure 7:
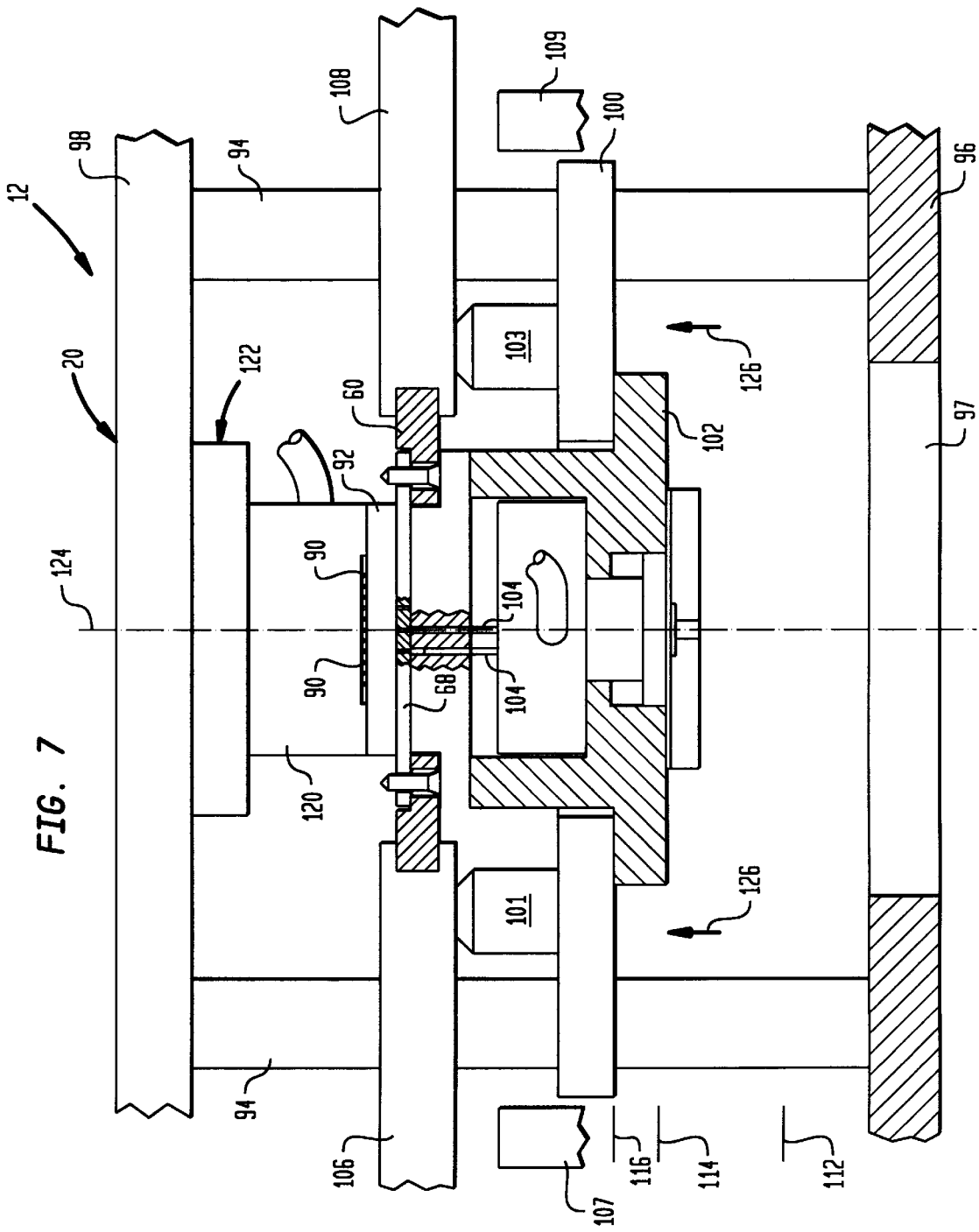
Figure 8:
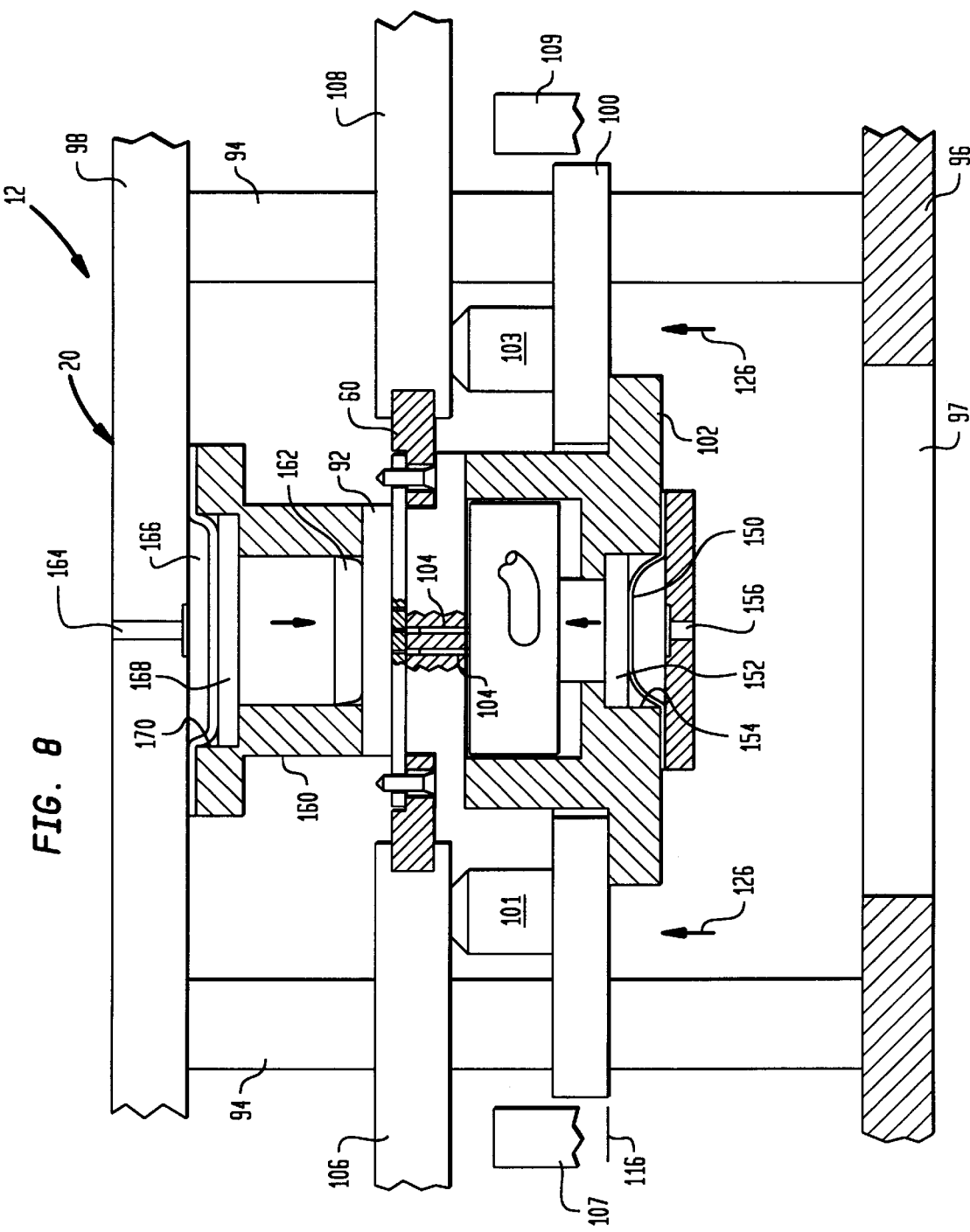
FIG. 8 illustrates an alternate embodiment of the test station of the substrate tester according to the present invention, including some features in partial cross-section, shown in an operating position similar to that as shown in FIG. 7.

Turning now to FIG. 8, I/O contactor pins 104 of test head assembly 102 are shown being pushed upward (from a non-contacting rest position as shown in FIG. 7) to contact the underside of test product 92. Actuation of the I/O contactor pins 104 for contacting the underside of test product 92 is accomplished by a combination of a rubber diaphragm 150 and a piston 152 within a cylindrical bore 154 of test head assembly 102 and the use of air pressure. Air pressure can be supplied via any suitable controllable air valve 156 to inflate rubber diaphragm 150. By the same token, air can be exhausted via the controllable air valve 156 by reversing the air flow away from diaphragm 150, as with suction.

While FIGS. 4–7 illustrate the use of buckling beam probe test head 120, FIG. 8 also illustrates the use of an alternate test head 160. Test head 160 includes a shorting pad 162 actuatable between a non-contacting position and a contacting position. The shorting pad 162 includes, for example, a rubber core having an outer covering of gold foil, such as disclosed in copending patent application U.S. serial no. 08/840,836, entitled "Substrate Tester Having Shorting Pad Actuator Method and Apparatus", filed concurrently herewith (Attorney Docket FI9-97-022). Such a shorting pad test head 160 may be used, where appropriate, instead of a buckling beam test head 120 to contact the top surface of the product 92, for example, to perform network opens tests. Shorting pad 162 is pushed downward against product 92 with air pressure. Air pressure can be supplied via any suitable controllable air valve 164 to inflate rubber diaphragm 166. By the same token, air can be exhausted via the controllable air valve 164 by reversing the air flow away from diaphragm 166, as with suction. Positive air pressure against rubber diaphragm 166 and piston 168 within cylindrical bore 170 results in shorting pad 162 being advanced in the downward direction into contacting engagement with the top surface of product 92.

When the lift plate 100 is driven upward in direction 126 in preparation for actuation of the buckling beam probe assembly 120 (i.e., to cause product 92 to make appropriate electrical contact with corresponding probes of probe assembly 120 as discussed with respect to FIGS. 4–7), in conjunction therewith, a mechanism for locating and clamping the test product or substrate 92 in a precise location for proper alignment and engagement with the probes of test head 120 is also actuated. For purposes of clarity, the locating and clamping mechanism has not been shown in the previous illustrations, however, it will now be discussed and shown with reference to FIGS. 9–12.

Figure 9:
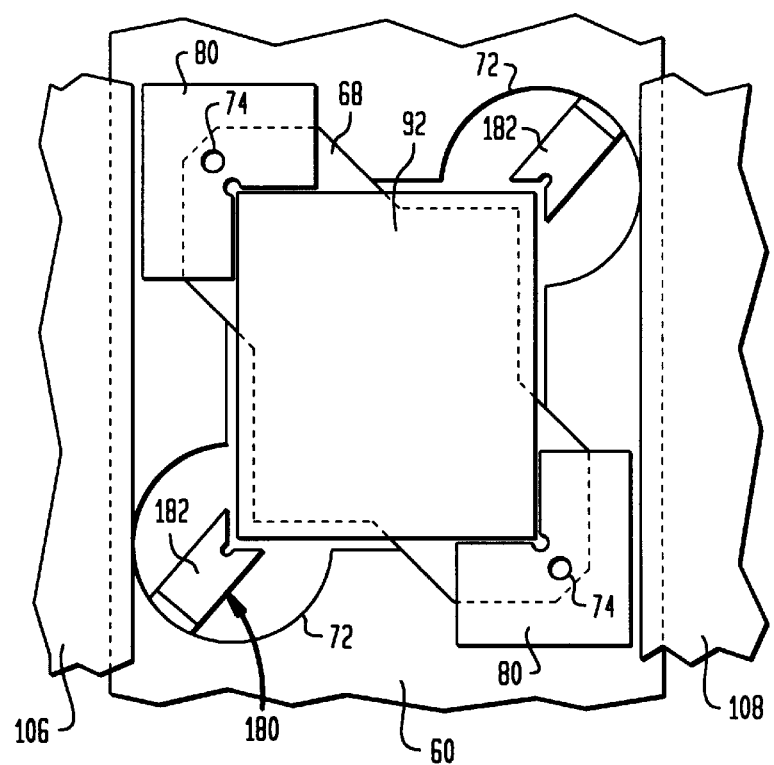
FIG. 9 illustrates a top view of the product carrier of FIG. 3 loaded within the test station of the substrate tester according to the present invention, where the substrate is initially located by stationary rough locators of the product carrier.
Figure 10:
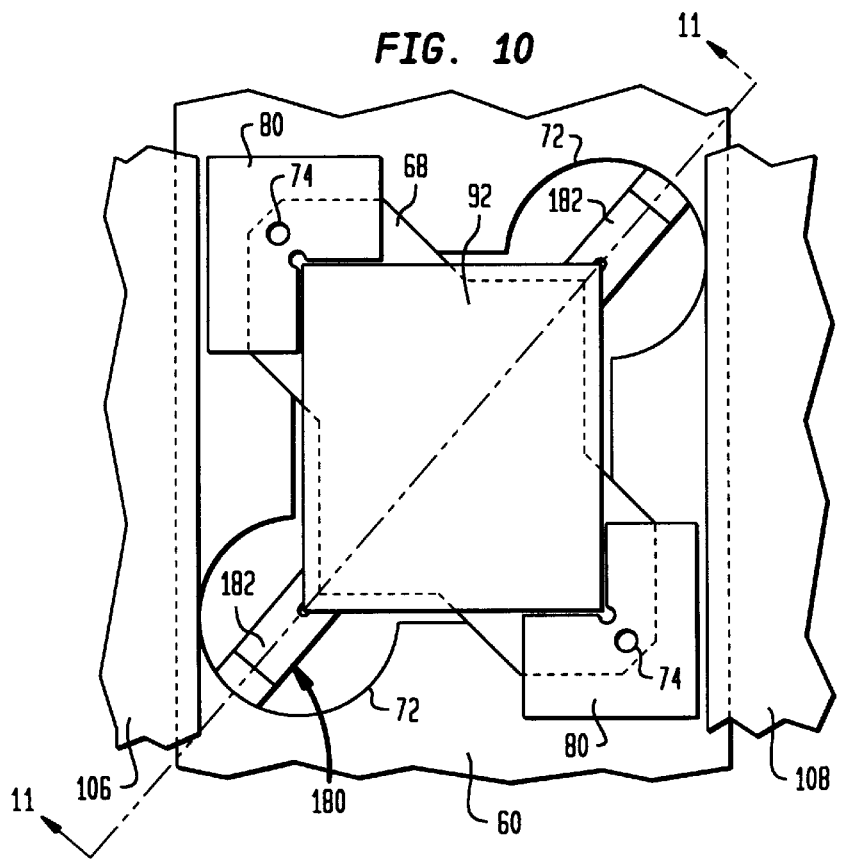
FIG. 10 illustrates a top view of the product carrier of FIG. 3 loaded within the test station of the substrate tester according to the present invention, where the substrate is located, positioned, and clamped by four-point locators of the test station.

FIG. 9 illustrates a top view of product carrier 60 in a forward or test position within mechanical handler 20 of test station 12. As previously discussed, product carrier 60 is inserted in corresponding receiving slots 110 of carrier plates 106 and 108 (FIG.4). As shown in FIG. 9, product 92 is roughly located by rough locators 80 of product carrier 60 and further is in an unclamped position resting on sieve plate 68. A locating and clamping mechanism 180 shall now be briefly described. For purposes of describing the present invention, locating and clamping mechanism 180 shall only be briefly described herein, since the locating and clamping mechanism is described with respect to a four-point locator apparatus, discussed in copending patent application, U.S. serial no. 08/840,833, entitled "Locator Actuation Method and Apparatus" filed concurrently herewith, (Attorney docket FI9-97-020). Locating and clamping mechanism 180 includes four-point locator jaws 182 as shown in an open position (corresponding to an unclamped position) and retracted below and under product carrier 60. Turning now to FIG. 10, the four-point locator jaws 182 are shown in a clamped position against product 92 (further corresponding to a closed position). Each locator jaw 182 is characterized by a square or right angle engagement surface, referred to as a V-shape engagement surface. The V-shape engagement surfaces each include a relief bore at the bottom of the V-shape for receiving a corner of the substrate therein during a locating of the substrate to insure side contact.

Figure 11:
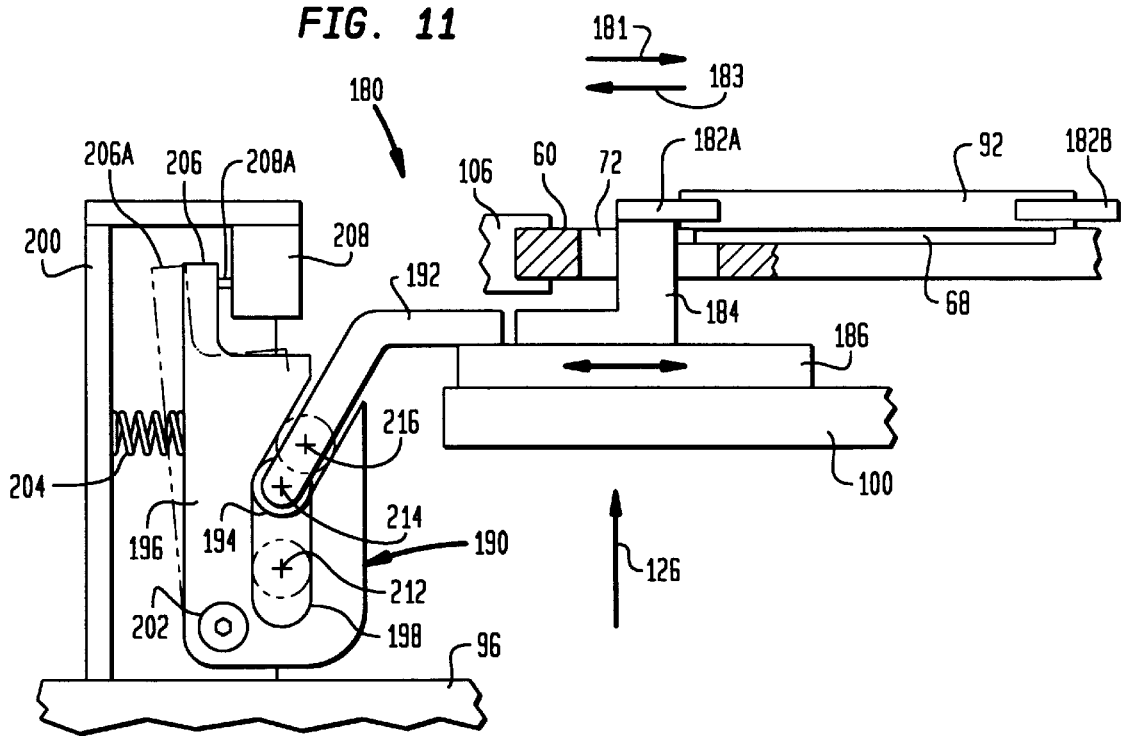
FIG. 11 illustrates a partial side view of the four-point locators of FIG. 10 and a combination of a cam block, actuator arm, and switch for use in conjunction with the four-point locators in the locating, positioning, and clamping of a substrate and for sensing a positioning condition of the same.

Turning now to FIG. 11, in part, there is illustrated a cross-sectional view of carrier plate 106, product carrier 60, four-point locator jaws 182, and product 92 taken along line II—II of FIG. 10. Each of the four-point locator jaws 182 is attached to jaw support post 184 (only one shown). Each jaw support post 184 is also mounted for translational movement on a separate precision slide 186 (only one shown). The precision slides 186 (only one shown) are further mounted on lift plate 100. As a result, slide 186 moves with lift plate 100 as lift plate 100 is raised or lowered as previously discussed herein with reference to FIGS. 4–7. A locating and clamping action of the locating and clamping mechanism 180 is effected by movement of precision slide 186 in a close direction (indicated by reference numeral 181), wherein the other precision slide (not shown) is coupled to the first slide for movement by an equal and opposite amount, to cause locator jaws 182 to clamp the substrate 92. Similarly, movement of precision slide 186 in an open direction (indicated by reference numeral 183), wherein the other precision slide (not shown) is coupled to the first slide for movement by an equal and opposite amount, causes locator jaws 182 to release and be disposed away from the substrate 92. While cam mechanism 190 is shown with simple detail in FIG. 11, the cam block 196, cam slot 198, and placement of switch 208 are shown in further detail in FIG. 12, such as could be used in an actual hardware design.

Figure 12:
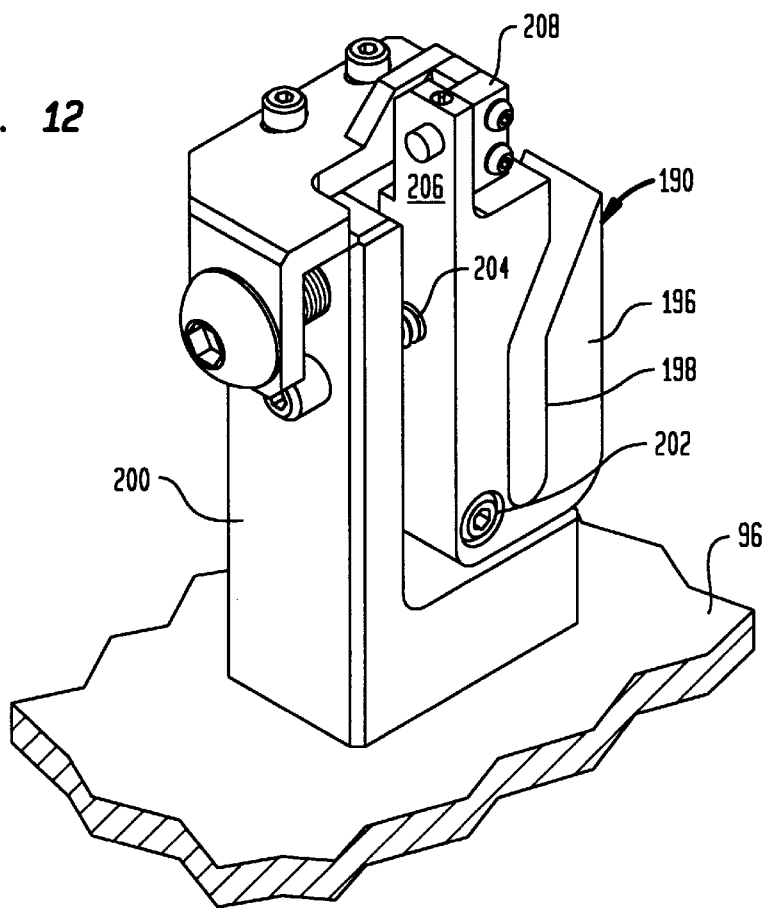
FIG. 12 illustrates a more detailed perspective view of the arrangement of the cam block and switch of FIG. 11.

In accordance with the present invention, actuation of the locating and clamping mechanism 180 is carried out with the use of a cam mechanism 190. Cam mechanism 190 includes a cam follower arm 188 attached to one of the precision slides 186 (only one shown), for example as shown in FIG. 11. A cam follower roller 190 is attached to an opposite end of cam follower arm 188 from slide 186, cam follower roller 190 being free to rotate. Cam mechanism 190 further includes a cam block 196 having a cam groove or slot 198, the cam groove being of a particular shape for providing a prescribed camming characteristic, as shall be explained herein below. Cam block 196 is further mounted at a lower portion thereof to a support member 200 via shoulder screw 202, wherein the support member 200 is mounted upon base plate 96. A compression spring 204 is positioned in a manner, for example as shown in FIGS. 11 and 12, so as to dispose cam block 196 to pivot slightly on shoulder screw 202 in a clockwise direction. An upper portion 206 of cam block 196 protrudes above a main portion of cam block 196 for engagement with a switch 208, to hold switch 208 in a normally closed. In a preferred embodiment, switch 208 includes a micro switch. Switch 208 is held closed when upper portion 106 of cam block 196 engages switch actuator 208A. Switch 208 acts as a product substrate/locator jaws-closed sensing switch, as shall be explained further herein below. Engagement of the upper portion 206 of cam block 196 with switch 208 limits the amount of pivotal movement in the clockwise direction of cam block 196 as a result of the force exerted upon cam block 196 by compression spring 204.

Still referring to FIGS. 9–12, the manner of operation of the locating and clamping mechanism 180 and the cam mechanism 190 shall now be discussed. In addition, a product test inhibit signal shall be discussed, in which the signal is used in stopping a testing operation when a product substrate is determined to be improperly loaded, skewed, or otherwise mispositioned. The product test inhibit signal is used by the test station controller for appropriately controlling a testing operation to advantageously prevent any undesired damage to the substrate and/or the test head assemblies.

As indicated above, cam follower arm 192 is attached to precision slide 186, which is further mounted on lift plate 100. As a result, when lift plate 100 is raised or lowered, cam follower arm 192 and cam follower roller 194 are also raised or lowered, as the case may be. When product carrier 60 is first inserted within carrier guide slots 110 of carrier plates 106 and 108 and pushed forward into the test position, cam follower roller 194 is in a first cam position 212 within cam slot 198 of cam block 196. This also corresponds to lift plate 100 being in position 112 as shown in FIG. 4. With lift plate 100 at position 112 and cam follower roller 194 at cam position 212, the four-point locator jaws 182 are in an open state and retracted below carrier plate 60. This positioning of the locator jaws 182 in an open state and below carrier plate 60 is shown, for example, in the top view illustration of FIG. 9.

As lift plate 110 is raised from position 112 to position 114, as discussed earlier herein above, cam follower roller 194 moves from the first cam position 212 to a second cam position 214 as shown in FIG. 11. In addition, as mentioned above, compression spring 204 causes cam block 196 to pivot slightly on shoulder screw 202 in a clockwise direction. With cam follower roller 194 in the second cam position 214, the force applied to cam block 196 by compression spring 204 is also applied to cam follower arm 192, the later of which pushes slide 186 towards the right. Movement of slide 186 to the right in the close direction 181 thus moves locator jaw 182A towards the right. Furthermore, movement of slide 186 in the close direction 181 causes locator jaws 182A and 182B to both move in a respective direction to locate and clamp the substrate 92, as disclosed in copending patent application U.S. Ser. No. 08/840,833, filed concurrently herewith, entitled "Locator Actuation Method and Apparatus", (Attorney docket FI9-97-020).

In continuation of the above discussion, as lift plate 100 is driven upward (from position 112 to position 114 as shown in FIG. 5), locator jaws 182A and 182B move up through corresponding locator jaw apertures 72 of product carrier 60 and in toward the product 92 (FIG. 11). When cam roller 194 reaches the second cam position 214 as shown in FIG. 11 locator jaws 182A and 182B are in the closed position against product 92. This positioning of the locator jaws 182A and 182B in a closed position is shown, for example, in the top view illustration of FIG. 10. As the lift plate 100 continues to move upward from position 114 to position 116 (FIG. 7), cam roller 194 moves from the second cam position 214 toward a third cam position 216 (FIG. 11). As cam roller 194 moves from the second cam position 214 toward the third cam position 216 and when a product 92 is properly located and positioned within the product carrier 60 by locator jaws 182A and 182B, cam block 196 discontinues pivoting in the clockwise direction and then pivots counterclockwise on shoulder screw 202. The pivotal rotation of cam block 196 in a counter clockwise direction is shown in phantom lines in FIG. 11, wherein the protruding portion 206 (shown in phantom lines and identified by reference numeral 206A) of cam block 196 no longer makes contact with switch actuator 208A of switch 208.

As discussed above, the action of the cam roller 194 moving from second cam position 214 to third cam position 216 causes switch 208 to be opened when product substrate 92 is properly located and positioned within locator jaws 182A and 182B. Switch 208 thus acts as a product substrate/locator jaws-closed sensing switch. The switching state of switch 208 can be effectively used for indicating that product 92 is clamped and in correct position for test. Alternatively, if product 92 was missing or mis-positioned, switch 208 would remain closed. Acting through suitable test station controller logical operations, a "System Error" condition could be alarmed and an appropriate action taken for effectively halting the continuation of a testing procedure in the test station, thus preventing any further actuation of the handler mechanism so that no damage would be incurred to the product and/or the tester. Still further, a product test inhibit signal can be generated by the opening of switch 208, as appropriate, whereby the signal can be used for triggering a stopping of a testing operation when a product substrate is determined to be improperly loaded, skewed, or otherwise mispositioned. The product test inhibit signal can be used by the test station controller for controlling the testing operation as appropriate for advantageously preventing any undesired damage to the substrate and/or the test head assemblies. That is, a product test inhibit signal could be used to halt further actuation of the test station loading and probing components. At such time, appropriate corrective action could be taken, such as, resetting the test station 12 and moving lift plate 100 to it's home position.

Thus, the present invention prevents undesired damage to the substrate 92 under test and furthermore prevents damage to the probes 90 of the test head assembly 120. Without the system error detection according to the present invention, a fragile substrate which does not get properly positioned, could end up being broken into numerous pieces. The numerous pieces would cause further problems within the test station, such as, becoming lodged within the handler mechanism and require a tear-down of the test station for removal.

The present invention further provides a vertical z-alignment height with a deceleration feature, further for enabling the alignment of the top surface of a product being tested at a prescribed z-axis height probing level. Referring again to FIG. 11, as lift plate 100 is driven upward to a point where cam follower roller 194 just starts to move from second cam position 214 to third cam position 216, gear motor 130 (FIG. 5) is controlled in a suitable manner via controller 40 to begin to slow down (decelerate) from a faster initial motor speed in preparation for stopping the product 92 at an alignment height, the alignment height corresponding to lift plate 100 being at position 116 of FIG. 7. Referring now to FIG. 13, lift plate 100 is shown at position 114 (as indicated also in FIG. 11). As lift plate 100 is driven upward toward position 116, switch 208 is caused to open by cam mechanism 190 as discussed herein above. A deceleration level indication switch can be used to trigger the tester logic to slow down the motor 130 (FIG. 5). Switch 208 is used for signaling that the product is properly clamped and located. The deceleration level switch includes a light beam generator 222 and sensor 224 used for initiating a deceleration of the lift motor. From position 114 to position 116, lift plate 100 continues upward at a slower rate once the deceleration level is detected so that the lift plate 100, and the associated hardware being lifted along with lift plate 100, will be able to be stopped quickly and accurately when a top surface 92A of product substrate 92 reaches the probing level for a testing operation.

The deceleration level is a z-axis height level at which a slowing down of motor 130 is initiated. Slowing down of motor 130 is done to decelerate the speed of upward travel of lift plate 100 and associated mechanisms attached thereto in preparation for stopping. Preferably, the deceleration level is monitored and determined by the level corresponding to when the top surface 92A of product 92 breaks light beam 220 generated by thru-beam light source 222 and received by thru-beam sensor 224. Sensor 224 is adapted to have adjustable positioning so that a desired deceleration level may be established. For instance, the desired deceleration level may be established during a set-up of the equipment in conjunction with achieving a desired transport time of the product under test from a home position to a testing position. That is, the speed of motor 130 is controlled in a manner for optimizing the time taken for transporting the product from a vertical home position to a vertical testing position, using a fast transport speed initially until the slow down level is reached, after which the transport speed is set at a lower speed in preparation for stopping at a precise vertical height. Light sensor 220 is adjusted for establishing the desired deceleration level such that when top surface 92A of product 92 reaches the desired deceleration level, the top surface 92A intersects the beam 220.

The probing or testing level for a testing operation is monitored and determined as that level corresponding to when the top surface 92A of product substrate 92 breaks light beam 220A generated by thru-beam light source 222 and received by thru-beam sensor 224A. When light beam 220A is broken or interrupted, the tester, logic is suitably programmed to stop the motor, in response to a sensor 224A signal that the light beam 220A is broken, so that product 92 is in a desired z-alignment height position.

The desired z-alignment height position is calibrated during a calibration in which the substrate is positioned under TV camera and optics 230. At the stop position, the top surface 92A of the product 92 is calibrated or adjusted to be in focus with respect to the TV. camera and optics 230. TV camera and optics 230 are characterized by a prescribed focal length, further having a resolution, for example, on the order of ±0.002 inches. An image of the substrate 92 may be displayed on any suitable TV monitor screen (not shown) for use when moving the substrate to be in focus with the TV camera and optics 230. When in the desired stop position, adjustments are made to the positioning of light source 222 and sensor 224A for establishing a z-alignment height calibration. The positioning of the light beam generator or source 222 and light beam sensor 224A is thus adjusted in accordance with the desired in-focus height (i.e., when the substrate is in focus). After a calibration of the positioning of source 222 and sensor 224A, the z-alignment positioning of the product can easily be repeatably obtained, as discussed herein above.

Figure 14A:
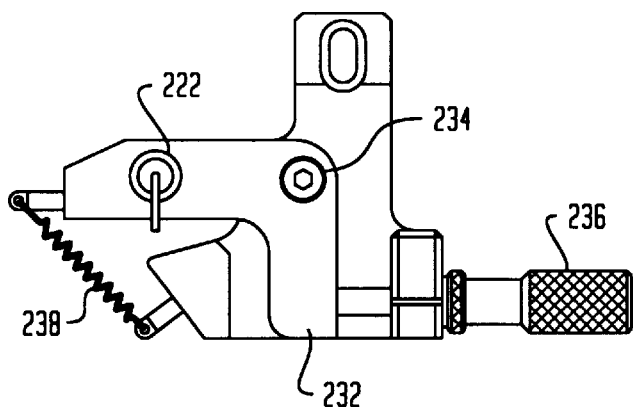
FIG. 14A and 14B illustrate in further detail the light source of FIG. 13.
Figure 14B:
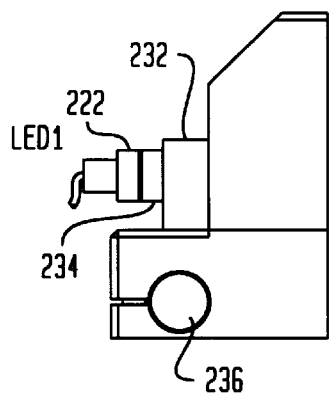
Figure 15A:
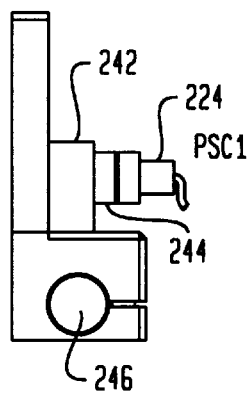
FIG. 15A and 15B illustrate in further detail one of the sensors of FIG. 13.
Figure 15B:
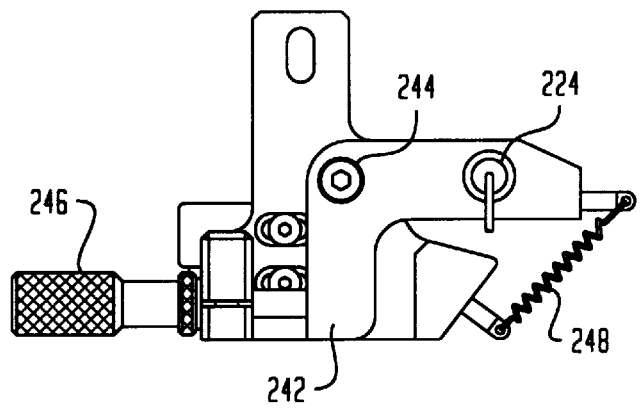

FIGS. 14 and 15 illustrate exemplary embodiments for an actual design of an adjustment mechanism for use with light beam generator 222 and light beam sensor 224, respectively. With respect to FIGS. 14A and 14B, light source 222 includes any suitable light source, such as an LED, and can be mounted on a pivot arm 232 which pivots about a pivot 234, such as a shoulder screw. A micrometer 236 can be used in a prescribed manner, for example, such that when the micrometer 236 is turned, pivot arm 232 is caused to pivot on shoulder screw 234 thus moving light source 222 up or down in a slight arc. A spring 238 is suitably coupled to the pivot arm 232 for disposing pivot arm 232 against micrometer 236. FIGS. 14A and 14B illustrate a rear view and a side view, respectively, of the light source 222 and adjustable positioning thereof in further detail. In a similar manner, sensor 224 is made to have a height adjustment. With respect now to FIGS. 15A and 15B, an adjustment mechanism for adjusting a positioning of sensor 224. Light sensor 224 includes any suitable light sensor and can be mounted on a pivot arm 242 which pivots about a pivot 244, such as a shoulder screw. A micrometer 246 can be used in a prescribed manner, for example, such that when the micrometer 246 is turned, pivot arm 242 is caused to pivot on shoulder screw 244 thus moving light sensor 224 up or down in a slight arc. A spring 248 is suitably coupled to the pivot arm 242 for disposing pivot arm 242 against micrometer 246. Light sensor 224A includes a similar mounting mechanism for height adjustability.

The present invention further provides a camera-probe fixed distance stroke for use during an alignment. Referring again to FIG. 13, TV camera 230 is mounted on a slide plate 250 a fixed distance "A" from test head probe assembly 120 which is also mounted on slide plate 250. Slide plate 250 is mounted on a suitable precision slide 252, the later of which is mounted to an underside of bridge 98. By means of a controllable air cylinder (not shown), slide plate 250 is moved on slide 252 a fixed distance "At" toward the right in order to position test head probe assembly 120 over product substrate 92 in a test position, for example, centered upon axis 124. In order to view the product top surface 92A, a test station operator performing a substrate test can, through appropriate tester logic, move the test head probe assembly 120 and the camera 230 back and forth from an alignment position (corresponding to the camera 230 being positioned directly over product 92) to a test position (corresponding to test head probe assembly 120 being positioned over product 92). In the alignment position, while viewing a product top surface 92A pattern on the TV monitor (not shown), the test station operator can make appropriate X-Y adjustments, through the use of a suitable X-Y adjustment mechanism (not shown) to position the test head probe assembly 120 accurately to ensure that probe contacts of the test- head assembly contact corresponding test pads (not shown) in X-Y alignment on product 92.

In operation, the product is located and clamped as the lift plate 100 is driven upwards. Repeatability of the positioning, locating and clamping of a substrate by jaws 182 of locating and clamping mechanism 180 is within less than one micron (1 $\mu$m) to the center of the product. Upon upward travel of the product intersecting the thru-beam 220, the motor 130 is controlled via appropriate control logic to be slowed down, thus controlling the speed of travel of lift plate 100 to be at a slower speed as plate 100 continues in the upward direction in preparation for stopping at the desired probing level. Prior to intersecting the stop beam 220A, the tester must determine whether or not the product is properly positioned, located and clamped. The product/jaws-closed sensing switch 208 indicates whether or not the product is accurately positioned, located and clamped. Positioning, locating and clamping of the product must occur prior to lift plate 100 reaching the desired probing level corresponding to the level defined by stop beam 220A. As soon as switch 208 changes its switching state, the product is then known to be properly located and positioned. If not, then the product is not properly positioned, located and clamped, and thus a fault occurs. Upon detection of an improper or mis-positioned substrate, a system error signal is issued. The system error signal terminates further actuation of mechanisms in the testing procedure such that appropriate corrective action may be taken, such as resetting of the tester to restart a testing procedure.

The present invention thus prevents undesired damage to product under test, the test station, and the test head probing assembly. As discussed, the present invention includes a loading and clamping method that detects if the product is positioned properly in the test station and which furthermore does not allow any probe actuation or testing to take place if proper positioning is not achieved. Thus costly damage to product and equipment is advantageously prevented.

The present invention further eliminates product damage by eliminating undesirable movement of the product (i.e., substrate) during a testing thereof when probing forces are applied. The present invention still further provides a rigid support for the product to rest upon during a testing operation, thereby eliminating product and probe damage known in the related art due to improper non-rigid support, for instance, when product is rested on top of spring probes. The product is securely and accurately positioned for testing, thus eliminating incidents of broken product, damaged product and damaged equipment.

The present invention furthermore enables use of a product slide to feed the tester instead of moving a testing contactor with cables in and out. The present invention solves the problem in that cable movement is dramatically reduced, thus advantageously avoiding conductor wiring fatigue and breakage.

In accordance with the present invention, the principal component of the tester which undergoes substantial movement consists of only the product carrier which moves in and out of the test station. That is, the product to be tested is loaded onto the carrier by a operator external to the tester. The product carrier is then positioned upon a slide and inserted into the test station for appropriate testing of the product. Thus, mechanical movement of the contactor cables of the test station, i.e., bending and flexing, is dramatically minimized. Broken conductors and costly repairs, in addition to equipment down time, are thus advantageously minimized and/or substantially avoided.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention, as limited solely by the appended claims.

What is claimed is:

1. A substrate tester for testing a substrate according to a particular testing operation, said tester comprising:

a substrate carrier for receiving the substrate to be tested therein, the substrate carrier having a rough locator for roughly locating the substrate therein with respect to said substrate carrier;

a lift plate having a first test head assembly and a substrate locator mechanism thereon, said lift plate being disposed for travel in a z-axis direction between a home position, an intermediate position, and a probing position, said lift plate further having mechanical stop pins thereon;

a carrier plate having slots therein for horizontally receiving the substrate carrier, said carrier plate being disposed for travel in the z-axis direction between the intermediate position and the probing position;

a bridge plate disposed above said lift plate, and said carrier plate, said bridge plate having a second test head assembly mounted on an underside thereof, the second test head assembly having a electrical contact disposed at the z-axis probing position; and means for controlling a travel of said lift plate from the home position to the probing position, wherein the mechanical stop pins of said lift plate pick up said carrier plate at the intermediate position, and further at the intermediate position, a top surface of the first test head assembly engages the substrate carrier from below and the substrate locator mechanism accurately positions, locates, and clamps the substrate with respect to an exact center of the substrate in a precise X-Y location.

2. The apparatus of claim 1, wherein said substrate carrier further includes a sieve plate for supporting the substrate between the rough locators, the sieve plate having probe apertures therein to enable a probing of the bottom of the substrate, the sieve plate further having a pair of alignment apertures for use in an alignment of the sieve plate with respect to the an underlying test head probe assembly.

3. The apparatus of claim 2, further wherein the first test head assembly having alignment pins thereon, the first test head assembly further having retractable probes, actuatable between a recessed position and an extended position.

4. The apparatus of claim 2, further wherein said substrate carrier is detachable from said tester.

5. The apparatus of claim 1, wherein the substrate locator mechanism on said lift plate includes a four-point locator mechanism having locator jaws disposed for movement between an jaws open position and a jaws closed position, said apparatus further comprising means for actuating a movement of the locator jaws in a close direction as said lift plate travels from the home position to the intermediate position.

6. The apparatus of claim 5, wherein said actuating means includes a cam follower arm assembly and cam block, wherein the cam follower arm assembly follows a positioning of the locator jaws in accordance with a camming slot in the cam block as the lift plate travels from the home position to the intermediate position.

7. The apparatus of claim 6, further comprising means for sensing a properly clamped and located substrate by the four-point locator mechanism, wherein said sensing means includes a switch positioned for engagement with the cam block, further wherein (i) a properly clamped and located substrate causes the cam follower arm assembly to pivot the cam block away from the switch, and (ii) in the absence of a properly clamped and located substrate, the cam follower arm assembly does not pivot away from the switch, in accordance with the camming slot as the lift plate travels from the intermediate position to the probing position, still further wherein the state of the switch is indicative of the presence or absence of a properly clamped and located substrate.

8. The apparatus of claim 5, further comprising means for sensing a properly clamped and located substrate by the four-point locator mechanism.

9. The apparatus of claim 8, further wherein said control means inhibits a continuation of a testing operation upon a sensing of an improperly clamped and located substrate in accordance with an output of said sensing means.

10. The apparatus of claim 1, further comprising controllable motor coupled for driving the lift plate to travel from the home position to the probing position; and means for detecting a deceleration position corresponding to a position along an upward z-axis travel direction prior to and proximate the probing position, wherein said control means controls a speed of said motor in response to a deceleration position detection signal to drive the lift plate from the home position to the deceleration position at a first speed and to drive the lift plate from the deceleration position to the probing position at a second speed, the second speed being slower than the first speed.

11. The apparatus of claim 10, further comprising means for detecting a stop position for said lift plate corresponding to the probing position, wherein said control means controls a speed of said motor in response to a stop position detection signal to stop the lift plate at the probing position.

12. The apparatus of claim 1, further comprising means for calibrating a z-height alignment position of the substrate under test when the substrate is in the probing position.

13. A method for testing a substrate according to a particular testing operation, said method comprising the steps of:

providing a substrate carrier for receiving the substrate to be tested therein, the substrate carrier having a rough locator for roughly locating the substrate therein with respect to said substrate carrier;

providing a lift plate having a first test head assembly and a substrate locator mechanism thereon, the lift plate being disposed for travel in a z-axis direction between a home position, an intermediate position, and a probing position, the lift plate further having mechanical stop pins thereon;

providing a carrier plate having slots therein for horizontally receiving the substrate carrier, the carrier plate being disposed for travel in the z-axis direction between the intermediate position and the probing position;

providing a bridge plate disposed above the lift plate and the carrier plate, the bridge plate having a second test head assembly mounted on an underside thereof, the second test head assembly having a electrical contact disposed at the z-axis probing position; and controlling a travel of the lift plate from the home position to the probing position, wherein the mechanical stop pins of the lift plate pick up the carrier plate at the intermediate position, and further at the intermediate position, a top surface of the first test head assembly engages the substrate carrier from below and the substrate locator mechanism accurately positions, locates, and clamps the substrate with respect to an exact center of the substrate in a precise X-Y location.

14. The method of claim 13, wherein the substrate carrier further includes a sieve plate for supporting the substrate between the rough locators, the sieve plate having probe apertures therein to enable a probing of the bottom of the substrate, the sieve plate further having a pair of alignment apertures for use in an alignment of the sieve plate with respect to the an underlying test head probe assembly.

15. The apparatus of claim 14, further wherein the first test head assembly having alignment pins thereon, the first test head assembly further having retractable probes, actuatable between a recessed position and an extended position.

16. The method of claim 13, wherein the substrate locator mechanism on the lift plate includes a four-point locator mechanism having locator jaws disposed for movement between an jaws open position and a jaws closed position, said method further comprising the step of actuating a movement of the locator jaws in a close direction as the lift plate travels from the home position to the intermediate position.

17. The method of claim 16, wherein said actuating step includes providing a cam follower arm assembly and cam block, wherein the cam follower arm assembly follows a positioning of the locator jaws in accordance with a camming slot in the cam block as the lift plate travels from the home position to the intermediate position.

18. The method of claim 17, further comprising the step of sensing a properly clamped and located substrate by the four-point locator mechanism, wherein said sensing step includes providing a switch positioned for engagement with the cam block, further wherein (i) a properly clamped and located substrate causes the cam follower arm assembly to pivot the cam block away from the switch, and (ii) in the absence of a properly clamped and located substrate, the cam follower arm assembly does not pivot away from the switch, in accordance with the camming slot as the lift plate travels from the intermediate position to the probing position, still further wherein the state of the switch is indicative of the presence or absence of a properly clamped and located substrate.

19. The method of claim 16, further comprising the step of sensing a properly clamped and located substrate by the four-point locator mechanism.

20. The method of claim 19, further wherein said control step further inhibits a continuation of a testing operation upon a sensing of an improperly clamped and located substrate in accordance with an output of said sensing step.

21. The method of claim 13, further comprising the step of providing a controllable motor coupled for driving the lift plate to travel from the home position to the probing position; and detecting a deceleration position corresponding to a position along an upward z-axis travel direction prior to and proximate the probing position, wherein said control step controls a speed of the motor in response to a deceleration position detection signal to drive the lift plate from the home position to the deceleration position at a first speed and to drive the lift plate from the deceleration position to the probing position at a second speed, the second speed being slower than the first speed.

22. The method of claim 21, further comprising the step of detecting a stop position for said lift plate corresponding to the probing position, wherein said control step controls a speed of the motor in response to a stop position detection signal to stop the lift plate at the probing position.

23. The method of claim 13, further comprising the step of calibrating a Z-height alignment position of the substrate under test when the substrate is in the probing position.

* * * * *